United States Patent
Smithers

(10) Patent No.: US 9,306,524 B2
(45) Date of Patent: Apr. 5, 2016

(54) AUDIO SIGNAL LOUDNESS DETERMINATION AND MODIFICATION IN THE FREQUENCY DOMAIN

(71) Applicant: DOLBY LABORATORIES LICENSING CORPORATION, San Francisco, CA (US)

(72) Inventor: Michael J. Smithers, Kareela (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/517,875

(22) Filed: Oct. 19, 2014

(65) Prior Publication Data

US 2015/0106083 A1 Apr. 16, 2015

Related U.S. Application Data

(63) Continuation of application No. 13/167,593, filed on Jun. 23, 2011, now Pat. No. 8,892,426, which is a continuation of application No. PCT/US2009/069178, filed on Dec. 22, 2009.

(60) Provisional application No. 61/140,791, filed on Dec. 24, 2008.

(51) Int. Cl.
*H03G 9/02* (2006.01)
*G10L 19/02* (2013.01)
(Continued)

(52) U.S. Cl.
CPC .............. *H03G 9/005* (2013.01); *G10L 19/022* (2013.01); *G10L 19/0204* (2013.01); *H03G 9/025* (2013.01)

(58) Field of Classification Search
CPC ... G10L 19/022; G10L 21/003; G10L 21/007; G10L 21/02; G10L 21/272; G10L 21/0316; G10L 21/0324; G10L 21/0332; G10L 21/034; G10L 25/03; G10L 25/45; G10L 25/48
See application file for complete search history.

(56) References Cited

U.S. PATENT DOCUMENTS

| 4,460,871 A | 7/1984 | Orban |
| 5,235,623 A | 8/1993 | Sugiyama et al. |

(Continued)

FOREIGN PATENT DOCUMENTS

| CN | 101155438 A | 4/2008 |
| EP | 1720249 A1 | 11/2006 |

(Continued)

OTHER PUBLICATIONS

Cassidy et al: "Efficient time-varying loudness estimation via the hopping Goertzel DFT", 2007 50th IEEE International Midwest Symposium on Circuits and Systems (MWSCAS '07), Aug. 5-8, 2007, Montreal, Que., Canada, pp. 421-422.

(Continued)

*Primary Examiner* — Eric Yen

(57) ABSTRACT

Methods of, apparatuses for, and non-transitory computer readable media having instructions thereon that when executed cause carrying out methods of determining and modifying the perceived loudness of a frequency domain audio signal where the frequency resolution, and corresponding temporal coverage of the frequency domain information is not constant. The frequency (and thus temporal) resolution of the perceived loudness processing is maintained constant at the longest block size. One method includes a block combiner and a loudness modification interpolator.

20 Claims, 11 Drawing Sheets

(51) Int. Cl.
*G10L 19/022* (2013.01)
*H03G 9/00* (2006.01)

(56) References Cited

U.S. PATENT DOCUMENTS

| | | | |
|---|---|---|---|
| 5,247,579 A | 9/1993 | Hardwick et al. | |
| 5,434,922 A | 7/1995 | Miller | |
| 5,579,430 A | 11/1996 | Grill et al. | |
| 5,682,463 A | 10/1997 | Allen et al. | |
| 5,699,479 A | 12/1997 | Allen et al. | |
| 5,819,214 A | 10/1998 | Suzuki et al. | |
| 5,893,061 A | 4/1999 | Gortz | |
| 5,901,234 A | 5/1999 | Sonohara et al. | |
| 6,029,126 A * | 2/2000 | Malvar | 704/204 |
| 6,092,040 A * | 7/2000 | Voran | 704/228 |
| 6,122,619 A * | 9/2000 | Kolluru et al. | 704/500 |
| 6,205,430 B1 | 3/2001 | Hui | |
| 6,230,125 B1 * | 5/2001 | Vainio | 704/230 |
| 6,456,963 B1 * | 9/2002 | Araki | 704/200.1 |
| 7,039,204 B2 | 5/2006 | Baumgarte | |
| 7,471,726 B2 * | 12/2008 | Srinivasan | 375/240.25 |
| 7,912,226 B1 | 3/2011 | James et al. | |
| 2002/0076072 A1 | 6/2002 | Cornelisse | |
| 2003/0115050 A1 | 6/2003 | Chen et al. | |
| 2003/0142746 A1 * | 7/2003 | Tanaka et al. | 375/240.11 |
| 2003/0223597 A1 | 12/2003 | Puria | |
| 2003/0235317 A1 | 12/2003 | Baumgarte | |
| 2004/0044525 A1 | 3/2004 | Vinton | |
| 2005/0159947 A1 | 7/2005 | Chen et al. | |
| 2005/0195995 A1 | 9/2005 | Baumgarte | |
| 2005/0197831 A1 | 9/2005 | Edler | |
| 2006/0002572 A1 | 1/2006 | Smithers et al. | |
| 2006/0025994 A1 | 2/2006 | Christoph | |
| 2006/0050898 A1 | 3/2006 | Yamada et al. | |
| 2006/0065106 A1 * | 3/2006 | Pinxteren et al. | 84/615 |
| 2006/0083163 A1 | 4/2006 | Rosen | |
| 2006/0161427 A1 | 7/2006 | Ojala | |
| 2006/0210096 A1 | 9/2006 | Stokes, III et al. | |
| 2006/0241941 A1 | 10/2006 | Chen et al. | |
| 2006/0241942 A1 | 10/2006 | Chen et al. | |
| 2007/0007945 A1 | 1/2007 | King et al. | |
| 2007/0016405 A1 * | 1/2007 | Mehrotra et al. | 704/203 |
| 2007/0092089 A1 | 4/2007 | Seefeldt et al. | |
| 2007/0121966 A1 | 5/2007 | Plastina et al. | |
| 2007/0174063 A1 * | 7/2007 | Mehrotra et al. | 704/501 |
| 2007/0223752 A1 | 9/2007 | Boretzki et al. | |
| 2007/0271093 A1 * | 11/2007 | Wang et al. | 704/210 |
| 2007/0291959 A1 | 12/2007 | Seefeldt | |
| 2007/0291960 A1 | 12/2007 | Sekiguchi | |
| 2008/0095385 A1 | 4/2008 | Tourwe | |
| 2008/0267425 A1 | 10/2008 | Le Faucheur et al. | |
| 2008/0267427 A1 | 10/2008 | Johnston | |
| 2008/0285775 A1 | 11/2008 | Christoph | |
| 2009/0161883 A1 | 6/2009 | Katsianos | |
| 2009/0299754 A1 * | 12/2009 | Mehrotra | 704/500 |
| 2009/0326962 A1 | 12/2009 | Chen et al. | |
| 2010/0083344 A1 | 4/2010 | Schildbach et al. | |
| 2010/0202632 A1 | 8/2010 | Seefeldt et al. | |
| 2010/0211395 A1 | 8/2010 | Beerends et al. | |
| 2011/0150229 A1 | 6/2011 | Krishnamoorthi et al. | |
| 2011/0238424 A1 | 9/2011 | Keiler et al. | |

FOREIGN PATENT DOCUMENTS

| | | |
|---|---|---|
| JP | 590389 | 12/2010 |
| WO | WO 94/09608 A1 | 4/1994 |
| WO | WO 00/65872 A1 | 11/2000 |
| WO | WO 2004/111994 A2 | 12/2004 |
| WO | WO 2006/047600 A1 | 5/2006 |
| WO | WO 2007/120452 A1 | 10/2007 |
| WO | WO 2007/127023 A1 | 11/2007 |

OTHER PUBLICATIONS

Cheng, Corey: "*Method for Estimating Magnitude and Phase in the MDCT Domain*", AES Convention: 116 (May 2004), Paper No. 6091, pp. 1-30.

Der et al: "*Towards a new perceptual coding paradigm for audio signals*", 2003 IEEE International Conference on Acoustics, Speech, and Signal Processing, Apr. 6-10, 2003, V-457-60 vol. 5, pp. 457-460.

Feiten et al. "*Audio Adaptation According to Usage Environment and Perceptual Quality Metrics*" 2005.

Hauenstein, Markus: "*A computationally efficient algorithm for calculating loudness patterns of narrowband speech*", 1997 IEEE International Conference on Acoustics, Speech, and Signal Processing; Munich, Germany, Apr. 21-24, 1997, vol. 2, pp. 1311-1314.

International Preliminary Report on Patentability for PCT Application PCT/US2009/069178 mailed Jul. 7, 2011.

International Search Report and Written Opinion for PCT Application PCT/US2009/069178 mailed Mar. 9, 2010.

Kaelin et al: "*A digital frequency-domain implementation of a very high gain hearing aid with compensation for recruitment of loudness and acoustic echo cancellation*", Signal Processing, vol. 64 No. 1, pp. 71-85, Jan. 1998.

Office Action 2 (including English translation) on Chinese patent application No. 200980151996.3 mailed Nov. 5, 2013.

Office Action and Search Report (including English translation) on Chinese patent application No. 200980151996.3 mailed May 29, 2013.

Purnhagen et al: "*Sinusoidal coding using loudness-based component selection*", 2002 IEEE International Conference on Acoustic, Speech and Signal Processing, Orlando, FL, United States, May 13, 2002-May 17, 2002, pp. 1817-1820.

Schildbach et al. "*Transcoding of dynamic range control coefficients and other Metadata into MPEG-4 HEAAC*" Oct. 2007.

Seefeldt et al. "*A New Objective Measure of Perceived Loudness*" 2004.

\* cited by examiner

AUDIO SIGNAL LOUDNESS DETERMINATION AND MODIFICATION IN THE FREQUENCY DOMAIN

This application is a continuation of U.S. patent application Ser. No. 13/167,593 filed Jun. 23, 2011. U.S. application Ser. No. 13/167,593 is a continuation of International Application Serial No. PCT/US2009/069178 filed Dec. 22, 2009. International Application PCT/US2009/069178 claims priority to U.S. Provisional Patent Application No. 61/140,791 filed Dec. 24, 2008. The contents of each of U.S. patent application Ser. No. 13/167,593, International Application PCT/US2009/069178 and U.S. Provisional Patent Application No. 61/140,791 are incorporated by reference herein in their entirety.

FIELD OF THE INVENTION

Background

Many methods exist for objectively determining the perceived loudness of audio signals. Methods also are known for scaling of the perceived loudness of an audio signal by a desired amount, using, for example, a perceptual loudness model. Methods also are known that include scaling the loudness of individual frequency bands, thus preserving the perceived loudness spectrum or timbre, whilst adjusting the overall perceived loudness. These methods typically split samples corresponding to a digitized audio signal to overlapping blocks that are transformed to a frequency domain. A transform so applied to overlapping block of data is called a "lapped transform." The methods for determining and possibly altering the perceived loudness use such lapped transforms as the short term discrete Fourier transform or the (short term) modified discrete cosine transform.

Perceptual coding methods also are known for compressing digitized audio signals, the coding methods including splitting samples corresponding to a digitized audio signal to overlapping blocks that are transformed to a frequency domain.

It is desired to determine and possibly modify the perceived loudness of audio signals that might be perceptually coded. Perceptual coding methods often have blocks lengths that vary over time. AC-3, also known as Dolby Digital, and AAC, also known as MPEG-2/AAC and MPEG-4/AAC, or simply MPEG/AAC audio each uses two block sizes. Efficiently determining and possibly modifying the perceived loudness of a frequency domain audio signal in the case of an audio signal block size that can vary can be a complex operation.

DESCRIPTION OF EXAMPLE EMBODIMENTS

Overview

Figure 1:
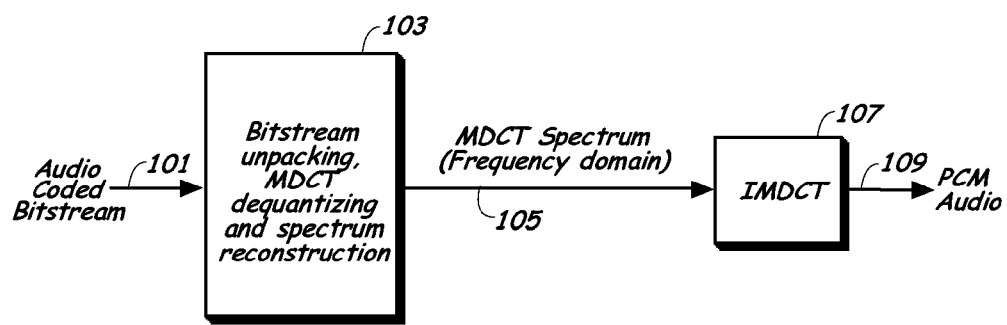
FIG. 1 shows a simplified functional block diagram of a perceptual audio decoder.

The present invention relates to methods of, apparatuses for, and computer readable media having instructions thereon that when executed cause carrying out methods of determining and modifying the perceived loudness of a frequency domain audio signal where the frequency resolution, and corresponding temporal coverage of the frequency domain information is not constant. This is directly applicable to perceptual audio coders where varying block sizes are used, such variable block sizes contributing to improved sound quality for transient audio signals.

One aspect for data that includes a plurality of block sizes includes holding the frequency (and thus temporal) resolution of the perceived loudness processing constant at the longest block size, including, for data at a particular short block size shorter than a longest block size of the plurality of block sizes, combine frequency domain information of a plurality of blocks at the particular short block size to form a longest-block-size data for input to the loudness processing, and interpolate gain information output from the loudness processing for such formed longest-block-size data for multiplication with the frequency domain signals at the particular short block size.

Particular embodiments include a method of processing of audio data that includes frequency domain data determined by a transform, e.g., a lapped transform at a plurality of block sizes. The method includes accepting blocks of frequency domain audio data at the plurality of block sizes. For accepted blocks of data at a particular short block size shorter than a longest block size of the plurality of block sizes, the method includes combining a plurality of blocks of frequency domain data at the particular short block size to form a block of frequency domain data at the longest block size. The method also includes carrying out the perceived loudness processing of the accepted blocks at the longest block size. The carrying out the perceived loudness processing includes determining one or more perceived loudness parameters. The loudness processing may include determining at least one loudness modification to apply to the accepted blocks of frequency domain data or delayed version thereof. The determining of the at least one loudness modification uses the one or more determined perceived loudness parameters.

The method may include, for the at least one loudness modification determined at the formed longest block size, interpolating the determined at least one loudness modification for application to the accepted blocks of data at the particular short block size used to form the determined at least one loudness modification, and applying the determined at least one loudness modification or at least one interpolated loudness modification to the accepted blocks of frequency domain data. The method may include delaying the blocks of frequency domain audio data, such that the at least one loudness modification or interpolated modification is applied to delayed versions of the blocks of frequency domain data.

In some embodiments, the at least one loudness modification includes a set of gains, so the interpolating determines interpolated gains, and applying the determined at least one loudness modification or interpolated loudness modification includes applying the set of gains or set of interpolated gains. In some embodiments in which the at least one loudness modification includes a set of gains, the interpolating determines interpolated gains and uses linear interpolation between determined gain values.

The combining the plurality of blocks of frequency domain data at the particular short block size to form a longest-block-size frequency domain data in some embodiments includes interleaving frequency domain data at the particular short block size. In other embodiments, the combining includes replicating values of frequency domain data at the particular short block size to create the longest-block-size frequency domain data. For example, the frequency domain data at the particular short block size of the latest particular short block size block is used to create the longest-block-size frequency domain data.

The one or more perceived loudness parameters may include the excitation of the audio data and the specific loudness of the audio data. Carrying out the perceived loudness processing may include one or more of loudness leveling, gain control, noise compensation, and/or dynamic equalization.

The transform may be lapped transform, e.g., a short time discrete Fourier transform (STDFT), or a modified discrete cosine transform (MDCT), or a short time discrete sine transform. Other lapped transforms also may be used.

The data may be from coded audio data coded by a perceptual coder that uses more than one block size. Examples include AC-3 and AAC.

Particular embodiments include an apparatus including a processing system that includes at least a processor and a computer readable medium, the processing system configured in operation to carry out a method of perceived loudness processing of audio data that includes frequency domain data determined by a transform, e.g., a lapped transform at a plurality of block sizes. The method includes accepting blocks of frequency domain audio data at the plurality of block sizes. For accepted blocks of data at a particular short block size shorter than a longest block size of the plurality of block sizes, the method includes combining a plurality of blocks of frequency domain data at the particular short block size to form a block of frequency domain data at the longest block size. The method also includes carrying out the perceived loudness processing of the accepted blocks at the longest block size. The carrying out the perceived loudness processing includes determining one or more perceived loudness parameters. The method may include, for the at least one loudness modification determined at the formed longest block size, interpolating the determined at least one loudness modification for application to the accepted blocks of data at the particular short block size used to form the determined at least one loudness modification, and applying the determined at least one loudness modification or at least one interpolated loudness modification to the accepted blocks of frequency domain data. The method may include delaying the blocks of frequency domain audio data, such that the at least one loudness modification or interpolated modification is applied to delayed versions of the blocks of frequency domain data. Different embodiments may include one or more of the features described above in this Overview section, or elsewhere herein.

Particular embodiments include a computer-readable storage medium configured with instructions that when executed by at least one processor carry out a method of perceived loudness processing of audio data that includes frequency domain data determined by a transform, e.g., a lapped transform at a plurality of block sizes. The method includes accepting blocks of frequency domain audio data at the plurality of block sizes. For accepted blocks of data at a particular short block size shorter than a longest block size of the plurality of block sizes, the method includes combining a plurality of blocks of frequency domain data at the particular short block size to form a block of frequency domain data at the longest block size. The method also includes carrying out the perceived loudness processing of the accepted blocks at the longest block size. The carrying out the perceived loudness processing includes determining one or more perceived loudness parameters. The method may include, for the at least one loudness modification determined at the formed longest block size, interpolating the determined at least one loudness modification for application to the accepted blocks of data at the particular short block size used to form the determined at least one loudness modification, and applying the determined at least one loudness modification or at least one interpolated loudness modification to the accepted blocks of frequency domain data. The method may include delaying the blocks of frequency domain audio data, such that the at least one loudness modification or interpolated modification is applied to delayed versions of the blocks of frequency domain data. Different embodiments may include one or more of the features described above in this Overview section, or elsewhere herein.

Particular embodiments include program logic that when executed by at least one processor causes carrying out a method of perceived loudness processing of audio data that includes frequency domain data determined by transform, e.g., a lapped transform at a plurality of block sizes. The method includes accepting blocks of frequency domain audio data at the plurality of block sizes. For accepted blocks of data at a particular short block size shorter than a longest block size of the plurality of block sizes, the method includes combining a plurality of blocks of frequency domain data at the particular short block size to form a block of frequency domain data at the longest block size. The method also includes carrying out the perceived loudness processing of the accepted blocks at the longest block size. The carrying out the perceived loudness processing includes determining one or more perceived loudness parameters. The method may include, for the at least one loudness modification determined at the formed longest block size, interpolating the determined at least one loudness modification for application to the accepted blocks of data at the particular short block size used to form the determined at least one loudness modification, and applying the determined at least one loudness modification or at least one interpolated loudness modification to the accepted blocks of frequency domain data. The method may include delaying the blocks of frequency domain audio data, such that the at least one loudness modification or interpolated modification is applied to delayed versions of the blocks of frequency domain data. Different embodiments may include one or more of the features described above in this Overview section, or elsewhere herein.

Particular embodiments include an apparatus for perceived loudness processing of audio data comprising frequency domain data determined by a transform, e.g., a lapped transform at a plurality of block sizes. The apparatus includes means for accepting blocks of frequency domain audio data at the plurality of block sizes. The apparatus also includes means for combining a plurality of accepted blocks of frequency domain data that are at a particular short block size shorter than a longest block size of the plurality of block sizes to form a block of frequency domain data at the longest block size. The apparatus also includes means for processing configured to carry out the perceived loudness processing of the accepted blocks at the longest block size. Carrying out the perceived loudness processing by the means for processing includes determining one or more perceived loudness parameters. The apparatus may further include means for determining at least one loudness modification using the one or more determined perceived loudness parameters, the at least one loudness modification being for applying to the accepted blocks of frequency domain data or delayed version thereof. The apparatus in such case further includes means for interpolating loudness modification coupled to the means for determining the at least one loudness modification, such that, for any of the at least one loudness modification determined at the formed longest block size, the determined at least one loudness modification are interpolated for application to the accepted blocks of data at the particular short block size used to form the determined at least one loudness modification. The apparatus in such case further includes means for applying the determined at least one loudness modification or interpolated modification to the accepted blocks of frequency domain data or delayed version thereof. The modifications may be in the form of a set of gains.

Particular embodiments include an apparatus for perceived loudness processing of audio data comprising frequency domain data determined by a transform, e.g., a lapped transform at a plurality of block sizes. The apparatus includes a block combiner configured to accept blocks of frequency domain audio data, each block being at one of the plurality of block sizes, including to accept blocks of data that are at a particular short block size shorter than a longest block size of the plurality of block sizes. The block combiner is further configured to combine the plurality of accepted blocks of frequency domain data at the particular short block size to form a block of frequency domain data at the longest block size. The apparatus further includes a frequency-domain signal processor configured to carry out the perceived loudness processing of the accepted blocks at the longest block size. Carrying out the perceived loudness processing by the frequency-domain signal processor includes determining one or more perceived loudness parameters. The frequency-domain signal processor may include a loudness modification determiner configured to determine at least one loudness modification to apply to the blocks of frequency domain data accepted by the block combiner or delayed version thereof. Such a loudness modification determiner uses the one or more determined perceived loudness parameters. The apparatus that includes the loudness modification determiner includes a loudness modification interpolator coupled to the frequency-domain signal processor and configured, for any set of one or more loudness modifications determined at the formed longest block size, to interpolate the determined at least one loudness modification for application to the accepted blocks of data at the particular short block size used to form the determined at least one loudness modification. The apparatus that includes the loudness modification determiner further includes a loudness modifier coupled to the loudness modification interpolator and to the input of the block combiner or to a delay element that is coupled to the input of the block combiner. The loudness modification determiner is configured to apply the determined at least one loudness modification or interpolated modification to the accepted blocks of frequency domain data or delayed version thereof. The modifications may be in the form of a set of gains.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Perceived Loudness and Perceptual Coding

Many methods exist for objectively determining the perceived loudness of audio signals. Examples of methods include A-weighted, B-weighted and C-weighted power measures of loudness that include applying a predetermined filter that emphasizes more perceptually sensitive frequencies and deemphasizes less perceptually sensitive frequencies, as well as psychoacoustic models of loudness such as described in ISO 532 titled "Acoustics—Method for calculating loudness level" (1975), that attempt to model the inner workings of the ear by dividing a signal into frequency bands and then manipulating and integrating these bands while taking into account psycho-acoustical phenomena such as frequency masking and temporal masking, as well as the non-linearity of loudness perception as a function of signal intensity.

International Application No. PCT/US2004/016964 designating the United States, published as WO 2004111994, published in the US as US 20070092089, and titled METHOD, APPARATUS AND COMPUTER PROGRAM FOR CALCULATING AND ADJUSTING THE PERCEIVED LOUDNESS OF AN AUDIO SIGNAL (hereinafter "WO 2004111994"), describes a perceptual method that goes beyond just loudness determination and provides for the scaling of the perceived loudness of an audio signal by a desired amount. In one embodiment described in WO 2004111994, a broadband gain is calculated from the desired change in perceived loudness by inverting a perceptual loudness model. International Application No. PCT/US2005/038579 designating the United States, published as WO 2006047600, also published in the US as US 20070291959, and titled CALCULATING AND ADJUSTING THE PERCEIVED LOUDNESS AND/OR THE PERCEIVED SPECTRAL BALANCE OF AN AUDIO SIGNAL (hereinafter "WO 2006047600") describes, inter alia, a method that goes even further by scaling the loudness of individual frequency bands, thus preserving the perceived loudness spectrum or timbre, whilst adjusting the overall perceived loudness. In one embodiments described in WO 2006047600, multi frequency band gains are calculated from the desired change in perceived loudness, as applied to multi frequency loudness bands.

The contents of each of WO 2004111994 and WO 2006047600 are incorporated herein by reference.

WO 2004111994 and WO 2006047600 describe methods that each include analyzing audio signal by first transforming the audio content into a frequency domain representation, typically using a lapped transform, e.g., an overlapped windowed form of the discrete Fourier transform—the Short Term Discrete Fourier Transform (STDFT), often referred to by its efficient implementation; the Fast Fourier Transform (PIT) and Short Term Fast Fourier Transform (STFFT). If perceived loudness adjustment is desired, embodiments of these applications describe how gains, calculated from inverting a loudness model, are multiplied with frequency domain information which is subsequently transformed back to the time domain audio signal by way of the corresponding Inverse Discrete Fourier Transform (IDFT), often referred to by its efficient implementation; the Inverse Fast Fourier Transform (IFFT).

Another time-to-frequency transform is the Discrete Cosine Transform (DCT). The DCT transform provides a more compact spectral representation of a signal and is thus widely used in image, video, and audio coding methods, also called compression methods. When used in audio coding, the DCT is used in windowed overlapped and modified form, with 50% overlap, and critically sampled to achieve time-domain aliasing cancellation. Such a lapped and modified DCT is commonly called the modified DCT (MDCT). Suppose the window is 2N samples long. The MDCT is not perfectly invertible, in that the MDCT of a window of 2N sampled, if subject to the inverse MDCT (IMDCT) does not produce the same 2N data samples. However, when subsequent blocks of inverse transformed data are added, using 50% overlap, the errors introduced by the transform cancel out. This is the time domain aliasing cancellation (TDAC) property. Thanks to the overlapping feature, the MDCT is very useful for quantization; it, for example, effectively removes the otherwise easily detectable blocking artifact between transform blocks, and is widely used in audio coding methods such as Dolby Digital (also called AC-3) and MPEG/ AAC, as well as image coding systems such as ITU-T H.261, H.263, MPEG-1, MPEG-2 video and JPEG. Dolby Digital is a trademark of Dolby Licensing Laboratories Corporation. Such coding includes dividing the to-be-coded audio signal or signals into overlapping windowed time segments, called audio blocks herein. The MDCT transform of each segment is perceptually coded, and quantized to compress the information. The quantized data is packed into a coded bitstream. During decoding, the segments are each unpacked, and passed through an inverse MDCT (IMDCT) transform (with overlap-add) to recreate the time domain PCM audio signal. Dolby Digital, for example, uses a long block size of 512 samples, where each half of the block overlaps with half of the adjacent block.

International Application No. PCT/US2007/007945 designating the United States, published as WO 2007120452, and titled AUDIO SIGNAL LOUDNESS MEASUREMENT AND MODIFICATION IN THE MDCT DOMAIN (hereinafter "WO 2007120452") describes, inter alia, how perceived loudness measurement and modification can be performed using information obtained using the modified discrete cosine transform (MDCT). This allows, for example, perceived loudness determination and modification to be efficiently integrated with low bit-rate audio decoders that typically use the MDCT. The contents of WO 2007120452 are incorporated herein by reference.

Note that WO 2007120452 refers to what here and commonly is referred to as the MDCT by the term STMDCT to be consistent with how the STDFT is used to describe a DFT of a windowed block of data in an overlapped manner. It is to be understood that the MDCT as used herein is the lapped windowed cosine transform that is critically sampled and achieves TDAC.

Perceptual audio coding methods are often designed to use lapped transform data at more than one block length, with the block length altered according to one or more certain characteristics of the audio signal. For example Dolby Digital uses two block sizes; a long block of 512 samples, e.g., for apparent stationary signals, and a short block of 256 samples, e.g., for rising transient audio signals. The result is that the number and width of frequency bands, and corresponding number of MDCT spectral values, varies block by block. Again using Dolby Digital as an example, when the block size is 512 time domain samples, there are 256 frequency bands (frequency bins) and when the block size is 256 time domain samples, there are 128 frequency bands (frequency bins). The reason that such both a short block size and a long block size are used is because perceptual coders, by their nature, introduce error or noise, due to quantization, as they compress or reduce the information rate of the audio signals. Quantization error or noise, especially from transient signals, spreads across the length of the block of audio samples and becomes audible. When short (time) sample blocks are used, the noise spreading is more localized in time, and therefore is less audible.

A perceptual audio coder using more than one block size presents difficulties for combining loudness determination and modification with an audio decoder. WO 2007120452 briefly discusses modifying a de-quantization process to always output a constant number of bands at a constant block rate by combining or averaging multiple smaller blocks into a larger block so that the loudness determination can be performed on a constant block size. WO 2007120452 also briefly discusses modifying loudness determination process to accept varying block sizes. Loudness determination typically includes filtering, excitation calculation, specific loudness calculation, averaging and summing, and WO 2007120452 suggests these be varied. This requires additional complexity beyond, for example, the complexity required to allow the block size to remain constant and combining shorter blocks.

It is desired to form practical methods for performing combining or averaging with different block length data, and how to determine gains and apply such gains to the audio signal for perceptual loudness modification when where the block size is varying.

Some Embodiments

Described herein are methods and apparatuses and software, e.g., processor executable instructions embodied in a computer readable media for determining and modifying the loudness of a frequency domain audio signal, where the audio signal block size can vary.

The embodiments described in detail herein assume the use of the MDCT spectrum used by perceptual audio coders. However, the inventive aspects apply as well to other transforms that transform between a first linearly spaced domain—the time domain—to a linearly spaced second domain—a frequency. Such other transforms include, but are not limited to the DFT discussed earlier, the STDFT (STFFT), the DCT (Discrete Cosine Transform), and others, including inverses to such transforms. How to modify the implementations described herein to use and/or be applicable to such other transforms would be clear and straightforward to one skilled in the art, and the claims are not meant to be limited to the MDCT or inverse MDCT (IMDCT), unless explicitly stated to be so limited.

FIG. 1 shows a simplified functional block diagram of a perceptual audio decoder. While in general a decoder such as shown in FIG. 1 is prior art, such a decoder that includes any of the inventive elements described herein is not prior art. Starting from a perceptually coded bitstream 101 of one or more audio signals (audio channels), a first element 103 generates the MDCT spectrum of each channel, and includes unpacking the bitstream into codewords, de-quantizing the codewords, and reconstructing the MDCT spectrum 105 of such each audio channel from the de-quantized codewords. The MDCT spectral information 105 includes the transform coefficients of transformed overlapping blocks of audio. Such spectral information is then converted to the time domain by element 107 using the IMDCT and de-overlapping the inverse transformed blocks of information to generate decoded digital audio. More specifically, the IMDCT is calculated, then the resulting time samples are windowed, and the first half of the windowed samples are added to the second half of the previous block to create the final output PCM time samples 109. Those in the art will understand that the de-overlapping occurs, and is implied whenever the IMDCT function is described to generate PCM audio.

Figure 2:
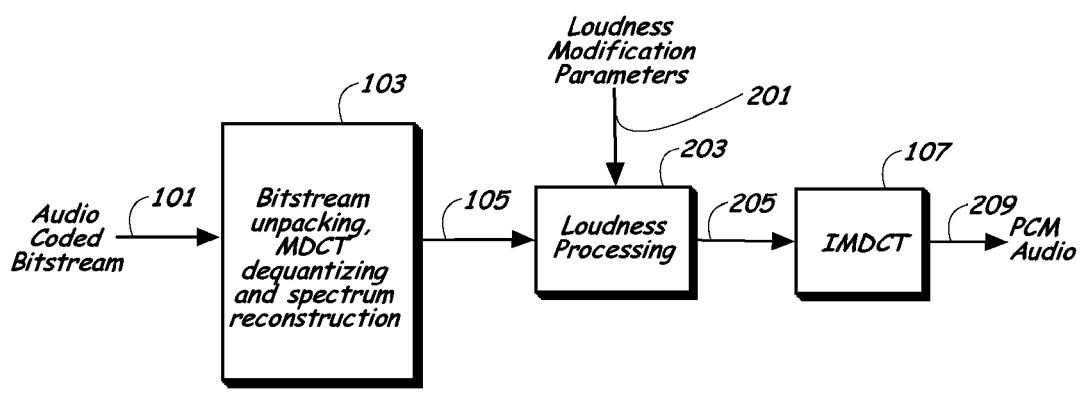
FIG. 2 shows a simplified block diagram of a perceptual audio decoder that includes loudness processing in the MDCT domain.

The decoded audio exists in the frequency domain 105 (prior to the IMDCT function). As described in WO 2007120452, loudness determination and modification can be performed prior to the IMDCT. FIG. 2 shows a simplified block diagram of a perceptual audio decoder that includes loudness processing in the MDCT domain. While in general a decoder such as shown in FIG. 2 is prior art, such a decoder that includes any of the inventive elements described herein is not prior art. Loudness processing element 203 is configured to carry out both loudness determination and modification of the audio signal according to one or more loudness modification parameters 201 to generate modified spectrum data 205 which, after inverse processing, results in the output audio data 209.

Figure 3:
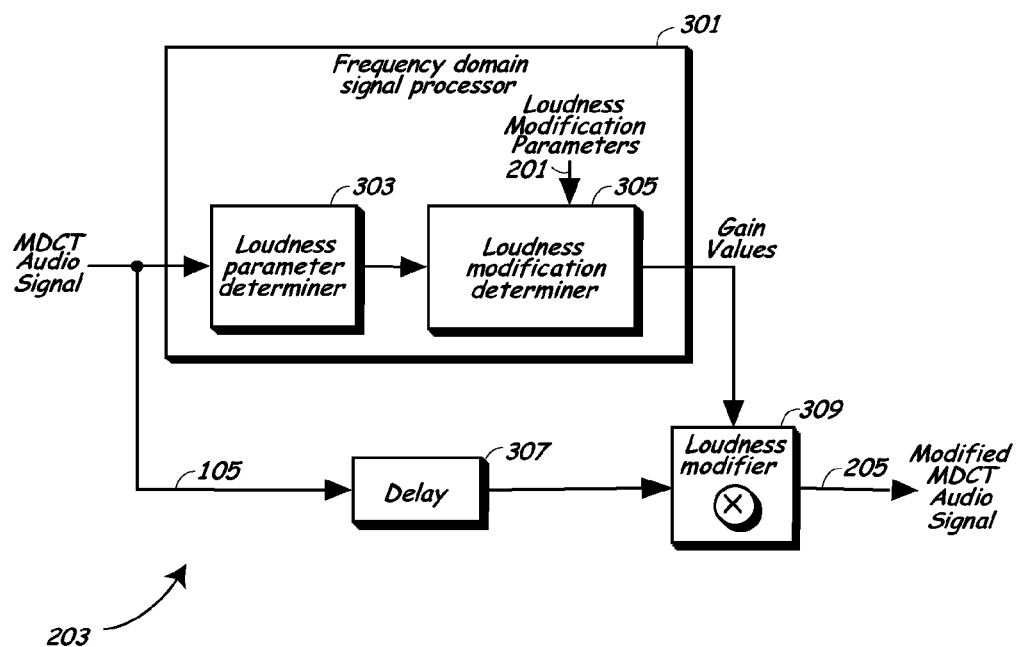
FIG. 3 shows a simplified block diagram that describes in more detail some of the processing in an embodiment of the loudness processing element of FIG. 2.

FIG. 3 shows a simplified block diagram that describes in more detail some of the processing elements in one embodiment of loudness processing element 203. The loudness processing element 203 includes a frequency domain signal processor 301 that includes a loudness parameter determiner 303 configured to determine one or more perceptual loudness parameters, e.g., the excitation and the specific loudness in the perceptual loudness domain of the MDCT audio signal 105. The resulting perceptual loudness parameters are modified by a loudness modification determiner 305, e.g., according to the one or more parameters 201 that specify desired changes to the loudness. For example, if the loudness processing includes noise compensation, the loudness modification parameters include the amount of noise compensation, the spectral values of the noise, desired specific loudness level, and so forth. In one embodiment, the loudness modification determiner 305 generates modifications to the specific loudness expressed as a set of gain values or a gain spectrum, e.g., one gain value for each MDCT frequency band in each audio channel, and such modification is calculated by a loudness modifier 309 that includes a multiplier element using the determined gains. Specific details of the loudness parameter determination and loudness modification calculation can be found in WO 2004111994 and WO 2006047600, and specifically in the MCDCT domain in WO 2007120452, and are not presented herein in detail in order not to obscure the inventive aspects of the invention. The MDCT audio signal 105 may be delayed by delay element 307 to provide the loudness determiner 303 and the loudness modification determiner 305 some look-ahead, that is, the ability to anticipate changes in the audio signal, such that the gains are applied in multiplier element 309 to delayed spectral data to produce the modified MDCT audio signal 205.

The apparatus of FIG. 3, and the method implemented thereby works well for a constant MDCT block size. If the block size changes over time, then the loudness determiner 303 and the loudness modification determiner 305 need to adapt to the new block size. This can be complex to implement. See WO 2007120452.

Figure 4:
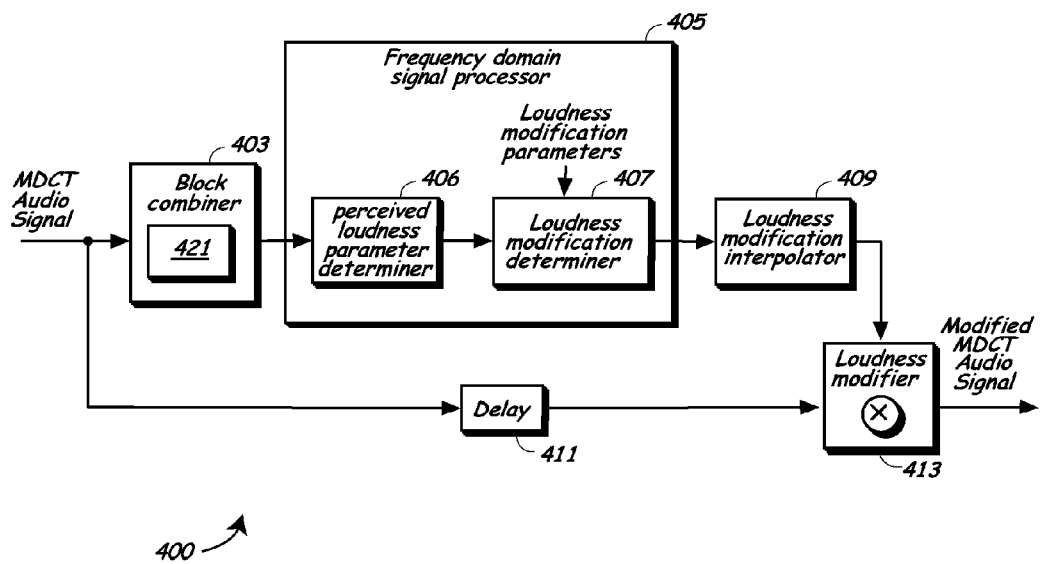
FIG. 4 shows one apparatus embodiment of the invention configured to determine loudness and to modify loudness in the frequency domain, e.g., the MDCT domain.

FIG. 4 shows one apparatus embodiment 400 of the invention configured to determine loudness and to modify loudness in the frequency domain, e.g., the MDCT domain. One feature of the embodiment of the present invention includes operating a frequency domain signal processor 405 that includes a loudness parameter determiner element 406 and a loudness modification determiner element 407, and that operates on data that is at the same block size or block rate as the largest MDCT block size used, e.g., the largest MDCT block size in the audio decoder if the determining and modifying is for data from a decoder. The apparatus includes a block combiner 403 configured to combine blocks that are smaller than the largest block size to form blocks at the largest block size, prior to the loudness parameter determining by the loudness parameter determiner 406 of the frequency domain signal processor 405. Embodiments further include a modification interpolator 409 to interpolate the modifications determined by the loudness modification determiner 407, e.g., a gain interpolator to interpolate the gains determined for a largest-size block that was obtained by combining blocks of a smaller block size. The delay element 411 accounts for the processing delay involved in blocks 403, 406, 407, and 409 so that the data presented to a loudness modifier element 413 is time aligned.

Combining Blocks

The block combiner 403 carries out block combining and is configured to construct a large-block-size MDCT spectrum for a large block size spectrum—a "long block" spectrum—from multiple smaller block-size spectra, not all necessarily the same short block-size relative to the largest block-size.

Typical perceptual audio coders that use more than one block length commonly use a multiple number of shorter blocks whose total number of MDCT spectral values is equivalent to the number of spectral values in a single relatively long block. Expressed in a different way, the total number of distinct sample time PCM audio samples used to calculate the sequence of short MDCT spectra is equivalent to the number of distinct sample time PCM audio samples used to calculate a single long MDCT spectrum. As one example, Dolby Digital uses a long block size of 512 samples, made up of 256 samples that overlap with the previous long block and 256 additional samples that overlap with the next long block, which results in 256 MDCT spectral values (frequency bins). When Dolby Digital uses short blocks, it uses short blocks in pairs of a first and a second short block. The first short block includes 256 samples that overlap with the previous block which after applying the MDCT results in 128 MDCT spectral values (frequency bins). The second short block is also of 256 samples that overlap with the next 256-long block which also results in 128 MDCT spectral values (frequency bins).

Another example is MPEG/AAC which uses a long block size of 2048 samples, giving 1024 MDCT values, and a short block size of 256 samples, giving 128 MDCT values. When MPEG/AAC uses short blocks, it always uses multiples of eight short blocks—an octet of blocks, so that there are 8×128=1024 MDCT values (frequency bins) in such an octet, the same number as for a single long block.

While many ways of carrying our combining step block combiner 403 are possible without deviating from the sprit of the present invention, two example methods are described herein. The first example method includes interleaving the MDCT values of shorter blocks to create a single spectrum of a long block. The second method uses a subset of the short block spectra and includes replicating values to create a single spectrum of a long block. In some such example methods of using replicating, the latest shorter spectrum is used to create the single spectrum of a long block.

Alternate embodiments of carrying out combining, e.g., of combining element 403 include interpolating between values of frequency domain data at the short block size to create the longest-block-size frequency domain data. This can be with the later data.

Figure 5A:
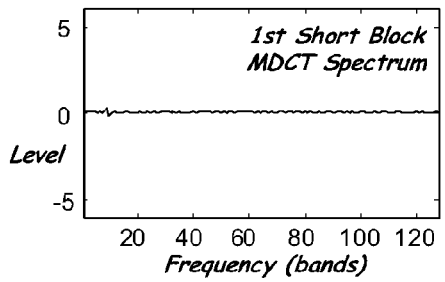
FIGS. 5A-5E show the different MDCT spectra involved in combining using an embodiment of the present invention using MDCT spectra obtained from a Dolby Digital signal of an example castanet hit.
Figure 5B:
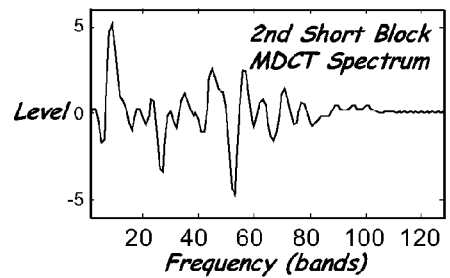
Figure 5C:
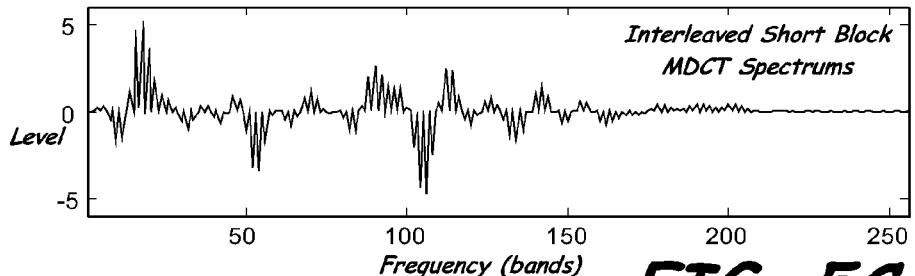
Figure 5D:
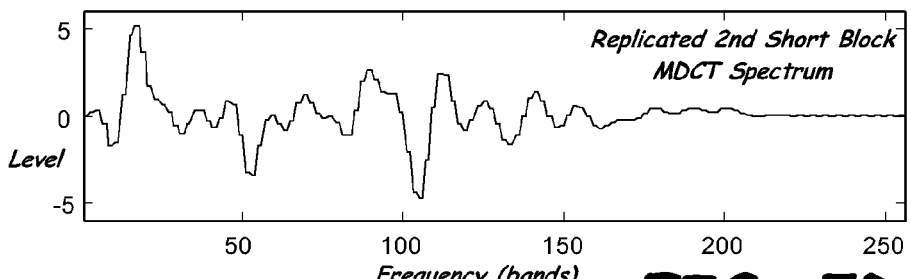

FIGS. 5A-5E shows example MDCT spectra based on Dolby Digital data of an example castanet hit. In particular, FIG. 5A and FIG. 5B show two consecutive short block MDCT spectra, each with 128 values. As can be seen, this is clearly a rising transient, as there is relatively little energy in all frequency bands in the first short block, relative to the amount of energy in the second block of MDCT data. FIG. 5C shows a spectrum with 256 frequency domain values determined from the spectra of FIG. 5A and FIG. 5B with interleaving. FIG. 5D shows a long block spectrum created by replicating adjacent values of the second short spectrum of FIG. 5B. This is useful to consider since coders like Dolby Digital choose to use short blocks when audio signal energy, especially high frequency energy, is rising rapidly. This is indicative of transients in the audio signal. As a consequence, the second short spectrum is a better representation of the overall spectrum of the audio signal used to create both short block spectra. This can be seen when compared to FIG. 5E.

Alternate embodiments of carrying out combining, e.g., of combining element 403 include interpolating between values of frequency domain data at the short block size to create the longest-block-size frequency domain data. This can be with the later data.

Figure 5E:
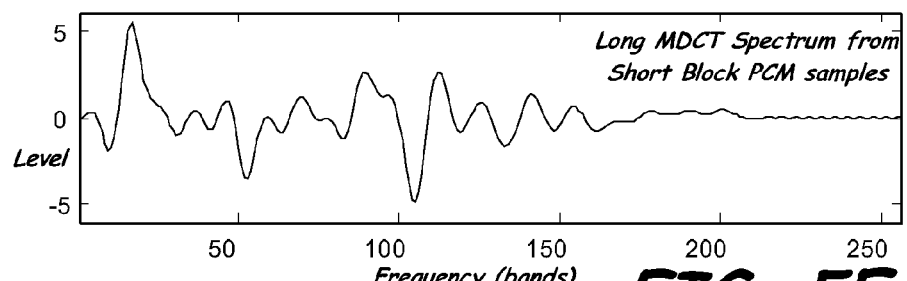

Finally as a reference, FIG. 5E shows a long MDCT spectrum calculated from the same samples used to calculate the two shorter MDCT spectra in FIG. 5A and FIG. 5B. This represents an idealized situation where Dolby Digital could run at higher than normal data rates and therefore would not need to use shorter blocks to minimize the audibility of quantization noise for transient signals. Dolby Digital would not actually calculate nor use the spectrum in FIG. 5E but it represents what would occur if the coder was limited to only use longs blocks.

For AAC and similar coding methods, the length of a long block is a multiple of more than two short blocks, e.g., 8 for AAC, and/or there a multiple types of long blocks, e.g., three for AAC, it is assumed that loudness is determined in substantially the same manner for each of the different types of long blocks. Some embodiments of the invention for such multiple block size select the largest size, and use interleaving to determine a long block of data from multiple short blocks of data.

Note that for rising transients, the later short blocks have increased power. As is known, because of perceptual masking of dropping transients, short blocks of transients include short block of rising transients. In some embodiments in which a long block has a length of an integer multiple greater than two of the length of a short block, e.g., 8 for AAC, a subgroup of consecutive later blocks that have overall energy above a pre-determined threshold are formed using interleaving, and these are then combined with the earlier blocks using either replication or interleaving to give a combined spectrum of a block having the long block. In some embodiments, the pre-determined threshold is half the total frequency domain energy of the last long-block-size block.

Determining Perceptual Loudness

WO 2004111994 describes an objective measure of perceived loudness based on a psychoacoustic model. While WO 2004111994 describes using the log power spectrum obtained, e.g., using a short time DFT, power determination from a set of MDCT spectra also is known. Consider the STDFT of a time varying windowed block of time samples x[n,t] were n is a time index within the block, and t is an index referring to the time. For blocks of length T samples, one commonly used calculation of time varying estimate of the power spectrum using the STDFT is $$P_{STDFT}[k, t] = \frac{1}{K}\sum_{\tau=0}^{K-1} |X_{STDFT}(k, t-\tau)|^2,$$

where k is the frequency bin for the STDFT, K is the number of frequency bins and time samples an a block of data, and $X_{STDFT}$(k,t) is the STDFT of x[n,t].

Denote by $X_{MDCT}$(k,t) the MDCT of time block t of length K samples. For most audio signals, $|X_{STDFT}$ (k,t)| and $\angle X_{STDFT}$ (k,t) vary relatively independently along blocks. Furthermore, for most audio signals, $\angle X_{STDFT}$(k,t) is distributed substantially uniformly between 0 and $2\pi$. In such a case it can be shown that $$P_{MDCT}[k, t] = \frac{1}{K}\sum_{\tau=0}^{K-1} |X_{MDCT}(k, t-\tau)|^2$$

$$\approx \frac{1}{2K}\sum_{\tau=0}^{K-1} |X_{STDFT}(k, t-\tau)|^2 = \frac{1}{2}P_{STDFT}[k, t].$$

Thus, the time-varying power spectrum can also be determined from a moving average of the square amplitude of the MDCT and produces approximately half the value obtained by using the STDFT. See WO 2007120452. Note that as an approximation, a single pole smoothing filter can be used, for which $$P_{MDCT}[k,t] = \lambda P_{MDCT}[k,t-1] + (1-\lambda)|X_{MDCT}[k,t]|^2,$$

where the half decay time of the smoothing filter is given by $$\frac{\log(1/e)}{\log\lambda},$$

and $P_{MDCT}$[k,t] thus determined provides an accurate power spectral measurement if K is large enough.

WO 2007120452 discusses how for applications involving perceptually based measurements and modifications, such as perceived loudness parameter determination and loudness modification according to loudness modifications determined by a loudness modification determiner, the values of a power spectrum P(k,t) at each and every frequency bin k are not as important as are the so-called critical bands that mimic the response of a human ear's basilar membrane at a particular location. Thus, for such applications, to determine the error introduced by using the MDCT rather than the STDFT to determine if K is large enough, can be carried out by examining the error within critical bands that mimic the response of the ear's basilar membrane at a particular location.

Determining a critical band power spectrum can be carried out by multiplying the power spectrum P(k,t) with critical band filters, denoted and then integrating across frequency bin k:

$$P^{CB}_{MDCT}[b, t] = \sum_k |C_b(k)|^2 P_{MCDT}[k, t],$$

where $C_b(k)$ denoted the response of the filter for critical band denoted by b. For forms of filters $C_b(k)$, see, e.g., WO 2007120452.

In implementation of perceived loudness determination, it is assumed that $P_{MDCT}^{CB}[b,t]$ provides a good estimate of the critical band power spectrum (except for the factor of 2).

Figure 6:
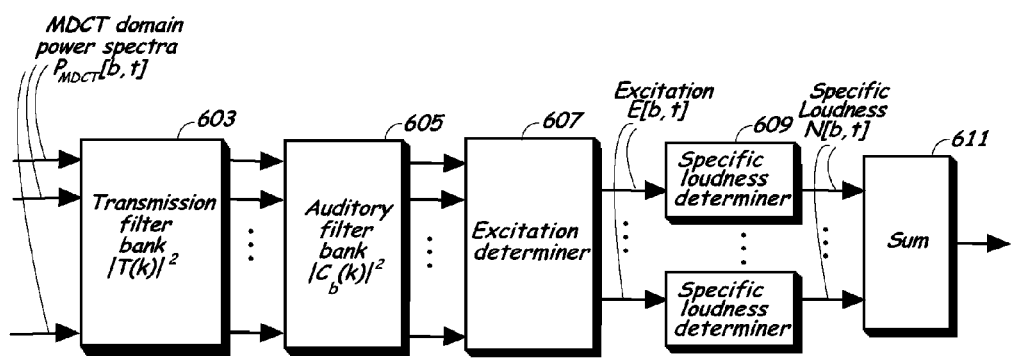
FIG. 6 shows a simple block diagram of an example of loudness determination using MDCT data and that is used in some embodiments of the present invention.

For the purpose of determining the specific loudness as an objective measure of perceived loudness, the power spectrum values, $P_{MDCT}(k)$, e.g., as derived from the partial decoding of a Dolby Digital bitstream, or otherwise, e.g., by taking the lapped MDCT transform of a block of sampled audio signal, may serve as inputs to a method of determining the perceived loudness. Such an arrangement is shown in the example of FIG. 6. Borrowing terminology and notation from WO 2004111994, an excitation signal E(b,t) for a block of data index t approximating the distribution of energy along the basilar membrane of the inner ear at critical band denoted b may be approximated from the power spectrum values as follows:

$$E[b, t] = \sum_k |T(k)|^2 |C_b(k)|^2 2 P_{MDCT}[k, t],$$

where T(k) represents the frequency response of a transmission filter and $C_b(k)$ represents the frequency response of the basilar membrane of a human subject at a location corresponding to critical band denoted b. Using equal loudness contours, the excitation at each band is transformed into an excitation level that generates the same loudness at 1 kHz. Specific loudness, a measure of perceptual loudness distributed across frequency, is then computed from the transformed excitation, denoted $E_{1\,kHz}[b,t]$, through a compressive non-linearity as follows:

$$N[b, t] = G \cdot \left( \left( \frac{E_{1kHz}[b, t]}{Q_{1kHz}} \right)^\alpha - 1 \right)$$

where $Q_{1\,kHz}$ denotes the threshold in quiet at 1 kHz and the constants G and α are chosen to match data generated from psychoacoustic experiments describing the growth of loudness.

For many forms of perceptual loudness processing modifications, the excitations and specific loudness values are used, e.g., to determine a set of gain values that achieve a desired result. Thus loudness parameter determiner 406 of FIG. 4 usually results in excitations and specific loudness values used by the loudness modification determiner 407.

The total perceived loudness, L, represented in units of sone, can computed by summing the specific loudness across the frequency bands:

$$L(t) = \sum_b N[b, t].$$

FIG. 6 shows a simplified block diagram of an MDCT domain loudness determiner Starting with MDCT-determined power spectra $P_{MDCT}[k,t]$, e.g., determined after the block combining of block combiner 403 for the case of short blocks, transmission filter bank 603 and auditory filter bank 605 implement filters $|C_b(k)|^2$ and $|C_b(k)|^2$, respectively. Excitation determiner 607 determined the excitation for the critical bands b. In some implementations, smoothing also is included. The resulting excitations L[b, t] are then input to a set of specific loudness determiners 609 to determine the specific loudness values N[b,t].

If it is desired to compute the total perceived loudness, a summer 611 adds the specific loudness values over all critical bands.

Figure 7A:
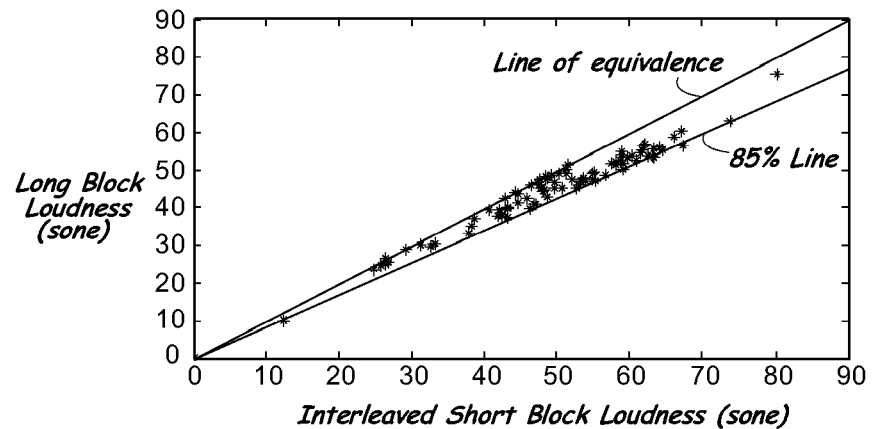
FIGS. 7A and 7B show a comparison of the loudness, determined in units of sone, for Dolby Digital data obtained from long blocks determined from short blocks using interpolation (FIG. 7A) and using replication (FIG. 7B).
Figure 7B:
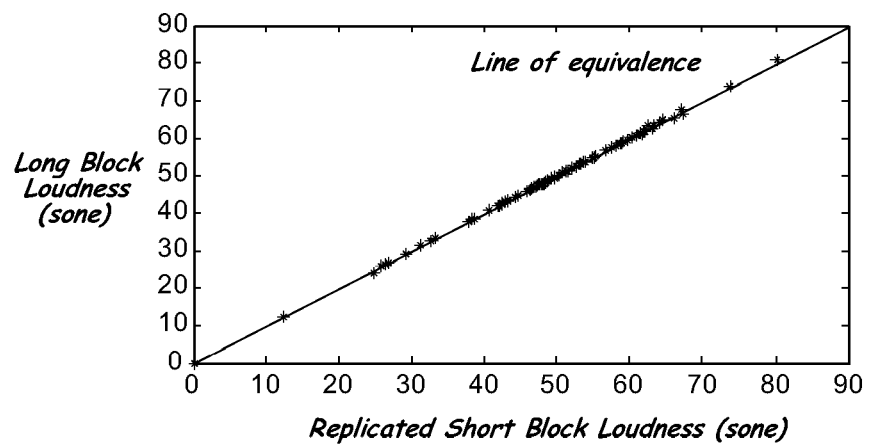

FIGS. 7A and 7B show a comparison of the total perceptual loudness, determined in units of sone, for Dolby Digital data obtained from long blocks determined from short blocks using interpolation (FIG. 7A) and using replication (FIG. 7B). The data is taken from data at a time where a Dolby Digital encoder uses short blocks. The horizontal axis shows the loudness measured from the original short blocks after either interleaving (FIG. 7A) of two consecutive short block MDCTs or replicating the second short block MDCT (FIG. 7B). The vertical axis shows the determined perceived loudness for the same portions of the audio signal but where the coder uses a long MDCT spectrum, e.g., as shown in FIG. 5E.

The diagonal line in both graphs represents equivalence where the perceived loudness determined from the short and long MDCT spectra is the same. In FIG. 7A, some of the points are below the equivalence line, indicating that the short MDCT interleaving method leads to slightly lower determined perceived loudness. For all signals measured, the temporary reduction in loudness is at most 15%. FIG. 7B, all points fall close to the equivalence line indicating that replicating values from the second short MDCT is almost the same as using a long MDCT.

Loudness Processing

Figure 8:
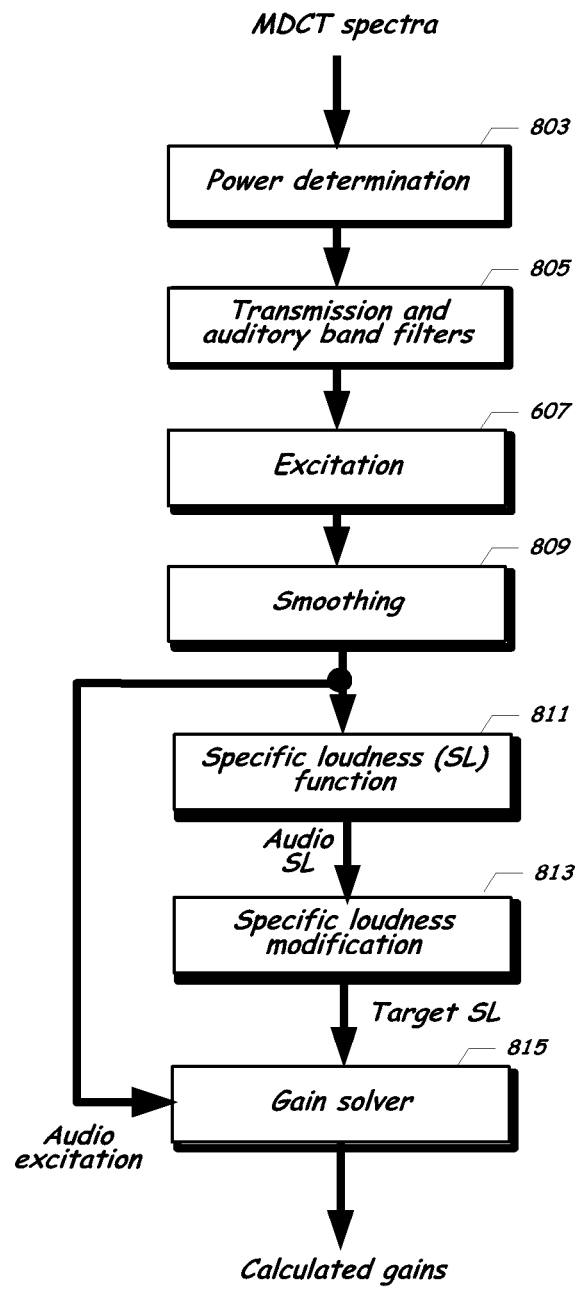
FIG. 8 shows a simple block diagram of an example of loudness determination and modification for leveling using MDCT data and that is used in some embodiments of the present invention.

Some typical loudness modifications that can be carried out by the combination of the loudness parameter determiner 406, the loudness modification determiner 407, and the loudness modifier 413 are now briefly described herein, and described in more detail in WO 2004111994 and WO 2006047600. Such processing that might be performed in the perceptual loudness domain includes loudness leveling, gain control, noise compensation, and/or dynamic equalization, or combinations of such processing. Each includes determining, from the excitations and specific loudness values, and possibly more information, e.g., noise excitations in the case of noise compensation, a set of time varying gains applicable to a set of frequency bands, e.g., the frequency index k to apply to the signal in the frequency domain. FIG. 8 shows one example of a combination of loudness determining to determine the audio excitation values and specific loudness values with a gain solver that determines a set of gains such that the specific loudness remains close to a target specific loudness. Such processing is called leveling, and commercially known as DOLBY VOLUME, a trademark of Dolby Laboratories Licensing Corporation. Starting with MDCT data, element 803 determines the power spectra, and elements 805 combine the transmission filtering of filterbank 603 and the auditory filter bank 605. The excitation determiner 607 is as in FIG. 6. FIG. 8 includes smoothing 809. Specific loudness determiner

811 determines the audio specific loudness (audio SL). A modification function 813 determines the target specific loudness (Target SL) that is to be used in the leveling. The gain solver 815 is configured to calculate a set of time-varying gains to apply in each frequency index k (or in some embodiments for each critical band b), and uses the target specific loudness and the audio excitation values. Typically, gain solver 815 uses iterative methods to determine the gains. Details are provided in WO 2004111994 and WO 2006047600, and WO 2007120452 when using MDCT data.

Gain Interpolator

Loudness modification interpolator 409, e.g., the gain interpolator in the case the modifications are calculated as a set of gains, is now described in more detail. Since the perceptual loudness processing assumes the longer MDCT size, the perceptual loudness processing outputs a set of gains— one per long MDCT spectral value. For application to short MDCT spectra, this long block spectrum set of gains is too long and needs to be reduced to one value per short MDCT value.

One embodiment carries out the opposite of the interleaving process by simply de-interleaving the long gains into multiple short sets of gains. This is very efficient. However, in coders such as Dolby Digital, differences in gain adjustment between MDCT spectra can cause audible discontinuities in the PCM audio that results after the IMDCT operation.

Some embodiments of the invention improve on this by creating a single set of gains usable for all the short MDCT spectra in a group that forms a long MDCT.

Figure 9:
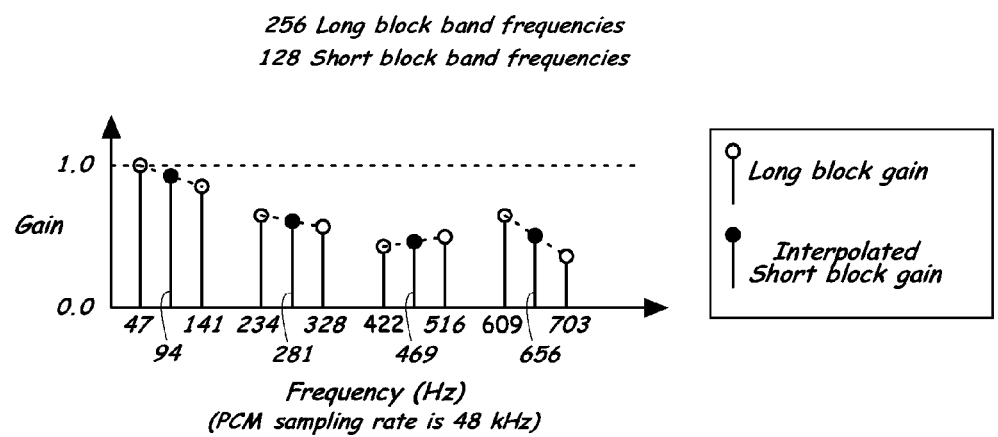
FIG. 9 illustrates by a simple example gain interpolation as applicable for perceptually coded data that uses a short block length of 256 time-domain samples and a long block length of 512 time-domain samples, e.g., Dolby Digital.

Various methods can be used to create a single shorter gain spectrum from the longer set. Some embodiments use linear interpolation between pairs of gain values. FIG. 9 illustrates by a simple example such linear gain interpolation as applicable for perceptually coded data that uses a short block length of 256 in the time domain and a long block length of 512 time domain samples, e.g., Dolby Digital. The center frequencies of the shorter MDCT spectrum fall between pairs of center frequencies from the longer MDCT spectrum. Pairs of gains from the larger spectrum can simply be averaged to calculate the gain values for the shorter spectrum.

Figure 10:
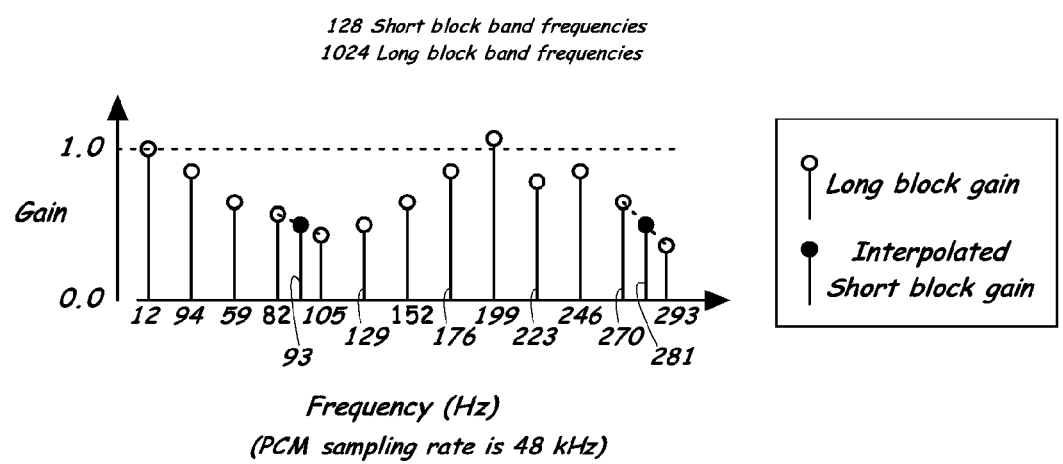
FIG. 10 illustrates by a simple example gain interpolation as applicable for perceptually coded data that uses a short block length of 256 time-domain samples and a long block length of 2048 time domain samples, e.g., MPEG-2/AAC and MPEG-4/AAC.

FIG. 10 illustrates by a simple example gain interpolation as applicable for perceptually coded data that uses a block length of 256 time domain samples and a long block length of 2048 time domain samples, e.g., MPEG-2/AAC and MPEG-4/AAC. The center frequencies of the shorter MDCT spectrum fall in the middle of every eight center frequencies of the longer MDCT spectrum. The gains for the shorter block frequency bins are calculated as the average of closest pair of long block gain values.

In an alternate set of embodiments, noting that there are eight times as many long block spectral bands as short block spectral bands, the gain for short blocks are calculated as the average of the eight closest long-block gains determined by the gain solver part of the processing.

Thus, the complete processing as shown in FIG. 4 includes determining a set of gains to apply to the accepted blocks of frequency domain data or delayed version thereof. The gain determining uses the perceived loudness parameters. For gains determined at a long block size determined from a long block generated from short blocks of frequency domain data, the method includes interpolating the determined gains for application to the accepted blocks of data at the short block size.

The complete processing method, as shown in FIG. 4, includes applying the determined gains or interpolated gains to the accepted blocks of frequency domain data or, as shown, to delayed version of the frequency domain data.

Note that while the gain interpolating step of the gain interpolator described above uses linear interpolation, alternate embodiments use other interpolation methods, e.g., second or higher order polynomial interpolation in some embodiments, or spline interpolation in alternate embodiments, based on the computational power available.

Figure 11:
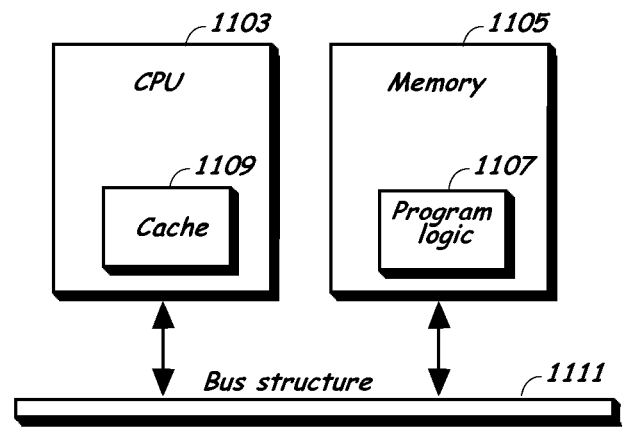
FIG. 11 shows a simplified block diagram of one apparatus embodiment that includes a processing system that is configured in operation to carry out a method embodiment of the invention. The apparatus includes a computer-readable storage medium configured with instructions that when executed cause a method embodiment of the invention to be carried out.

FIG. 11 shows a simplified block diagram of one apparatus embodiment that includes a processing system 1100 that is configured in operation to carry out any of the methods described herein. The processing system includes a processor, in this case a central processing unit (CPU) 1103 and a memory 1105. The CPU 1103 and memory 1105 are coupled by a bus structure 1111 that for simplicity is shown as a single bus. The CPU includes a cache structure 1109 that includes one or more caches. The memory include program logic 1107, e.g., instructions that when executed causes the processing system to carry out a method embodiment as described herein. Of course a processing system includes several more elements, and such are left out of FIG. 11 in order not to obscure the aspects shown, in particular, a storage medium 1105 configured with instructions 1107 that when executed cause a method of processing of audio data that includes frequency domain data determined by a transform, e.g., a lapped transform at a plurality of block sizes. The method, as described herein, includes accepting blocks of frequency domain audio data at a plurality of block sizes. For accepted blocks of data at a particular short block size of the one or more block sizes shorter than the longest block size, the method includes combining a plurality of blocks of frequency domain data at the particular short block size to form a block of frequency domain data at the longest block size. The method also includes carrying out the perceived loudness processing of the accepted blocks at the longest block size. The carrying out the perceived loudness processing includes determining one or more perceived loudness parameters.

While the description has been for data produced from Dolby Digital and AAC encoded data, the invention is applicable to any data that is presented in the frequency domain, e.g., determined by a lapped transform at a plurality of block sizes. As such, it is applicable to audio data that is presented encoded according to a published known standard or specification, and also to data that is encoded in a particular proprietary manner. Furthermore, the coder can be a transform coder of which Dolby Digital is an example, or a hybrid coder, of which AAC is an example.

Furthermore, while embodiments have been described herein using the MDCT, the invention may be practiced with transform data obtained by other transforms, e.g., other lapped transforms such as the lapped version of the DFT—the short time DFT (STDFT), the discrete sine transform (DST) in lapped transform, which would be the short time discrete sine transform, or any transform that transforms to a frequency domain.

Furthermore, the method described herein can be embedded in an audio decoder device, or in any processing device coupled to a decoder or otherwise provided with the frequency domain data.

Furthermore, those skilled in the art would understand the method is applicable audio data comprising frequency domain data determined by a transform, e.g., a lapped transform at a plurality of block sizes, wherein the audio can be of a single or multiple channels of audio data.

While perceptual coding is described herein, such as volume control, AGC, dynamic range control, noise compensation, and/or dynamic equalization, or combinations thereof is described in some detail herein, this is not meant in any way to limit the type of signal processing to which the invention is limited. The invention is applicable to signal processing operations on media data that has multiple block sizes provided in the frequency domain that is related to time domain data by a transform, e.g., a lapped transform.

Note that while the above description and patent application publications WO 2004111994 and WO 2006047600 describe some methods of determining the specific loudness, other method also are known for determining the specific loudness. See, for example, WO 2007120453.

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical quantities, such as electronic, quantities into other data similarly represented as physical quantities.

Note that when a method is described that includes several elements, e.g., several steps, no ordering of such elements, e.g., ordering of steps is implied, unless specifically stated.

Some embodiments include a computer-readable medium that is configured with program logic, e.g., that stored a set of instructions that when executed by at least one processor, causes carrying out a set of method steps of methods described herein.

The methodologies described herein are, in some embodiments, performable by one or more processors that accept computer-executable (also called machine-executable) program logic, e.g., instructions embodied on, e.g., encoded, or otherwise stored or configured in one or more computer-readable media. The instructions when executed by one or more of the processors carry out at least one of the methods described herein.

The term "processor" may refer to any device or portion of a device that processes electronic data, e.g., from registers and/or memory to transform that electronic data into other electronic data that, e.g., may be stored in registers and/or memory. Any processor capable of executing a set of instructions (sequential or otherwise) that specify actions to be taken are included. A "computer" or a "computing machine" or a "computing platform" may include at least one processor. Common examples include microprocessors, microcontrollers, digital signal processing (DSP) devices that combine a processor with special purpose hardware applicable to common signal processing tasks, computing cores designed into a chip, and so forth.

One example of a processing system that includes one processor or more than one processor. Each processor may include one or more of a processing unit (a CPU), a graphics processing unit, an arithmetic processing system, multiply-add subsystems, and/or a programmable DSP unit. The processing system further includes a storage medium or subsystem, which may include memory embedded in a semiconductor device, or a separate memory subsystem including main RAM and/or a static RAM, and/or ROM, and also cache memory. The storage subsystem may further include one or more other storage devices, such as magnetic and/or optical storage devices. A bus subsystem may be included for communicating between the components. The processing system further may be a distributed processing system with processors coupled by a network. If the processing system requires a display, such a display may be included, e.g., a liquid crystal display (LCD), plasma display, OLED display, or a cathode ray tube (CRT) display, and so forth. If manual data entry is required, the processing system also includes an input device such as one or more of an alphanumeric input unit such as a keyboard, a pointing control device such as a mouse, and so forth. The terms storage device, storage subsystem, etc., unit as used herein, if clear from the context and unless explicitly stated otherwise, also encompasses a storage device such as a disk drive unit or solid state drive. The processing system in some configurations may include a sound input device, a sound output device, a video input device and/or and a network interface device.

The storage subsystem thus includes computer-readable storage medium that that is configured with, e.g., that encoded/stores logic (e.g., software) including instructions to cause when executed, carrying out of one of more of the methods described herein. The program logic may reside in a hard disk, or may also reside, completely or at least partially, within the RAM and/or within the processor during execution thereof by the processing system. Thus, the memory and the processor in combination and individually constitute computer-readable storage medium on which is encoded program logic, e.g., in the form of instructions.

Furthermore, a computer-readable medium may form, or be included in a computer program product.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The one or more processors may form a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the logic including instructions, those skilled in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer-readable medium configured with a set of instructions, e.g., a computer program that are for execution on one or more processors, e.g., one or more processors that are part of a signal processing apparatus. Thus, as will be appreciated by those skilled in the art, embodiments of the present invention may be embodied as a method, an apparatus such as a special-purpose apparatus, an apparatus such as a data processing system, or a computer-readable medium, e.g., a computer program product that is configured with executable instructions. Some embodiments of the invention may also be in the form of logic that when executed by one or more processors cause carrying out of any one or more of the methods described herein. Accordingly, aspects of the present invention may take the form of a method, an entirely hardware embodiment, an entirely software embodiment or an embodiment combining software and hardware aspects. Furthermore, the present invention may take the form of program logic, e.g., in a computer readable medium, e.g., a computer program on a computer-readable storage medium, or the computer-readable storage medium configured with computer-readable program code, e.g., a computer program product.

While the computer-readable storage medium is shown in an example embodiment to be a single medium, the term "medium" should be taken to include a single medium or multiple media (e.g., several memories, a centralized or distributed database, and/or associated caches and servers) that store the one or more sets of instructions. A computer-readable storage medium may take many forms, including but not limited to non-volatile media and volatile media. Non-volatile media includes, for example, optical, magnetic disks, and magneto-optical disks. Volatile media includes dynamic memory, such as main memory.

It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. A method of using a signal processing apparatus to determine an objective measure of the perceived loudness of an audio signal, the method comprising:

accepting blocks of frequency-domain audio data into the signal processing apparatus, each accepted block of frequency-domain audio data having a block size of a set of block sizes, each accepted block of frequency-domain audio data being the transform of a corresponding block of time samples of an audio signal, the set of block sizes comprising a smallest block size and a largest block size, each block size being the smallest block size or an integer multiple of the smallest block size each block size of the set being no smaller than the smallest block size and no larger than the largest block size;

for each block size smaller than the largest block size, combining a plurality of accepted blocks having the same size as each other and having a size which is one of the plurality of block sizes size, the combining of the plurality forming a formed block of frequency domain data having the largest block size;

determining and/or accepting one or more perceived loudness parameters of the accepted blocks or of delayed versions of the accepted blocks, wherein each one of the one or more perceived loudness parameters comprises a respective set of parameter values, with one parameter value of the set for each critical frequency band of a set of critical frequency bands, wherein the critical frequency bands are at a frequency resolution that corresponds to the largest block size, and wherein the one or more perceived loudness parameters provide an objective measure of perceived loudness, and include at least one of:

a critical-band power spectrum of the accepted blocks or of delayed versions of the accepted blocks, the critical-band power spectrum comprising spectrum values at the set of critical frequency bands and a specific loudness of the accepted blocks or of delayed versions of the accepted blocks, the specific loudness comprising specific loudness values at the set of critical frequency bands; and determining at least one perceived loudness modification to the audio signal, the modification applicable in the frequency domain at the frequency resolution that corresponds to the largest block size, the determining of the at least one perceived loudness modification using the one or more perceived loudness parameters.

2. A method as recited in claim 1, further comprising:

for each block size of the set of block sizes other than the largest block size, interpolating the determined at least one loudness modification, and applying the interpolated determined at least one loudness modification to the accepted blocks of data having said each block size other than the largest block size or to delayed versions of the accepted blocks of data having said each block size less than the largest block size, and applying the determined at least one loudness modification to the accepted blocks of frequency domain data having the largest block size or to delayed version of the accepted blocks of frequency domain data having the largest block size.

3. A method as recited in claim 2, wherein the combining of each plurality of consecutive blocks having the same block size smaller than the largest block size includes at least one of the set consisting of:

interleaving frequency domain data of the blocks being combined;

replicating values of frequency domain data of the blocks being combined;

interpolating between values of frequency domain data of the blocks being combined, and for a particular block size that is a divisor of the largest block size and is smaller than half of the largest block size, and for a particular plurality of consecutive blocks having the particular block size, the particular plurality starting with a first subgroup of consecutive blocks that in combination have energy no larger than a pre-determined level, the first subgroup followed by a second subgroup of consecutive blocks of the particular plurality that forms the end of the particular plurality, the consecutive blocks of the second subgroup in combination having energy greater than the pre-determined level, partitioning the particular plurality of consecutive blocks into the first subgroup and the second subgroup, combining the consecutive blocks of the second subgroup, the combining using interleaving to form a block of frequency domain data having an intermediate block size larger than the particular block size and smaller than the largest block size, and combining the block of frequency domain data having the intermediate block size with the first subgroup of consecutive blocks of frequency domain data, the combining using replication or interleaving, the combining resulting in the formed block of frequency domain data at the largest block size.

4. A method as recited in claim 2, further comprising delaying the accepted blocks of frequency domain audio data, such that the applying the interpolated determined at least one loudness modification applied to delayed versions of the accepted blocks of frequency domain data having other than the largest block size and the applying the determined at least one loudness modification is to delayed versions of the accepted blocks of frequency domain data having the largest block size.

5. A method as recited in claim 2, wherein each modification in the determined at least one perceived loudness modification includes a corresponding set of gains, wherein the interpolating of each of the determined at least one loudness modification determines a corresponding set of interpolated gains, wherein applying each modification of the determined at least one loudness modification includes applying the corresponding set of gains, and wherein applying each modification of the interpolated determined at least one loudness modification includes applying the corresponding set of interpolated gains.

6. A method as recited in claim 2, wherein the one or more perceived loudness parameters include excitation parameters and specific loudness parameters, and wherein the at least one perceived loudness modification includes one or more of loudness leveling, gain control, noise compensation, and dynamic equalization.

7. A method as recited in claim 2, wherein the transform is a lapped transform applied to overlapping blocks of time samples.

8. A method as recited in claim 7, wherein the transform is a short time discrete Fourier transform, a short time discrete sine transform, or a modified discrete cosine transform.

9. A method as recited claim 2, wherein the frequency-domain audio data are from coded audio data coded by a perceptual coder, the coder using more than one block size.

10. A method as recited in claim 9, wherein the more than one block size used by the perceptual coder includes a small block size corresponding to 256 time domain samples and a long block size corresponding to 512 time domain samples.

11. A method as recited in claim 9, wherein the more than one block size used by the perceptual coder includes a small block size corresponding to 256 time domain samples and a long block size corresponding to 2048 time domain samples.

12. A non-transitory computer readable medium configured with instructions that when executed by at least one processor processes audio data to determine an objective measure of perceived loudness of the audio signal, the processing comprising:

accepting blocks of frequency domain audio data, the blocks of frequency domain data determined by a lapped transform, the accepted blocks having a plurality of block sizes, the plurality of block sizes including a longest block size and at least one other size smaller than the longest block size;

for each short block size of the plurality of block sizes, each short block size being shorter than the longest block size, for accepted blocks having said each short block size, combining a plurality of accepted blocks of frequency domain data having the same short block size as each other, the combining of the plurality forming a formed block of frequency domain data having the longest block size; and carrying out perceived loudness processing on each accepted block having the longest block size, and on each formed block having the longest block size, wherein the carrying out of the perceived loudness processing is at the longest block size, and wherein the carrying out the perceived loudness processing includes determining one or more perceived loudness parameters, the perceived loudness parameters providing an objective measure of perceived loudness.

13. A non-transitory computer readable medium as recited in claim 12, wherein the perceived loudness processing further includes:

using the one or more determined perceived loudness parameters, determining at least one loudness modification;

for accepted block having the longest block size, applying the determined at least one loudness modification to the accepted blocks of frequency domain data or to delayed version of the accepted blocks of frequency domain data; and for accepted blocks having other than the longest block size, for each short block size of the plurality of block sizes, each short block size being shorter than the longest block size, interpolating the determined at least one loudness modification, the interpolating producing interpolated determined at least one loudness modification, and applying the interpolated determined at least one loudness modification to the accepted blocks of data having said each block size other than the largest block size or to delayed versions of the accepted blocks of data having said each block size less than the largest block size.

14. A non-transitory computer readable medium as recited in claim 12, wherein the combining of each plurality of consecutive accepted all having said each short block size smaller than the longest block size includes at least one of the set consisting of:

interleaving frequency domain data of the blocks being combined;

replicating values of frequency domain data of the blocks being combined;

interpolating between values of frequency domain data of the blocks being combined, and for a particular block size that is a divisor of the longest block size and is smaller than half of the longest block size, and for a particular plurality of consecutive blocks having the particular block size, the particular plurality starting with a first subgroup of consecutive blocks that in combination have energy no larger than a pre-determined level, the first subgroup followed by a second subgroup of consecutive blocks of the particular plurality that forms the end of the particular plurality, the consecutive blocks of the second subgroup in combination having energy greater than the pre-determined level, partitioning the particular plurality of consecutive blocks into the first subgroup and the second subgroup, combining the consecutive blocks of the second subgroup, the combining using interleaving to form a block of frequency domain data having an intermediate block size larger than the particular block size and smaller than the longest block size, and combining the block of frequency domain data having the intermediate block size with the first subgroup of consecutive blocks of frequency domain data, the combining using replication or interleaving, the combining resulting in the formed block of frequency domain data at the longest block size.

15. A non-transitory computer readable medium as recited in claim 13, wherein the frequency-domain audio data are from coded audio data coded by a perceptual coder, the coder using more than one block size.

16. An apparatus for processing of audio data the apparatus comprising:

a processing engine comprising one or more processors; and a storage subsystem coupled to the processing engine, the storage subsystem comprising one or more non-transitory media, the media having stored therein instructions that when executed by at least one processor of the one or more processors, causes:

accepting blocks of frequency-domain audio data into the apparatus, each accepted block of frequency-domain audio data having a block size of a set of block sizes, each accepted block of frequency-domain audio data being the transform of a corresponding block of time samples of an audio signal, the set of block sizes comprising a smallest block size and a largest block size, each block size being the smallest block size or an integer multiple of the smallest block size each block size of the set being no smaller than the smallest block size and no larger than the largest block size, for each block size smaller than the largest block size, combining a plurality of accepted blocks having the same block size as each other, the combining of the plurality forming a formed block of frequency domain data having the largest block size;

determining and/or accepting one or more perceived loudness parameters of the accepted blocks or of delayed versions of the accepted blocks, wherein each one of the one or more perceived loudness parameters comprises a respective set of parameter values, with one parameter value of the set for each critical frequency band of a set of critical frequency bands, wherein the critical frequency bands are at a frequency resolution that corresponds to the largest block size, and wherein the one or more perceived loudness parameters provide an objective measure of perceived loudness, and include at least one of:

a critical-band power spectrum of the accepted blocks or of delayed versions of the accepted blocks, the critical-band power spectrum comprising spectrum values at the set of critical frequency bands and a specific loudness of the accepted blocks or of delayed versions of the accepted blocks, the specific loudness comprising specific loudness values at the set of critical frequency bands; and determining at least one perceived loudness modification to the audio signal, the modification applicable in the frequency domain at the frequency resolution that corresponds to the largest block size, the determining of the at least one loudness modification using the one or more perceived loudness parameters.

17. An apparatus as recited in claim 16, wherein the perceived loudness processing further includes:
for accepted block having the longest block size, applying the determined at least one loudness modification to the accepted blocks of frequency domain data or to delayed version of the accepted blocks of frequency domain data; and
for accepted blocks having other than the longest block size, for each short block size of the plurality of block sizes, each short block size being shorter than the longest block size, interpolating the determined at least one loudness modification, the interpolating producing interpolated determined at least one loudness modification, and applying the interpolated determined at least one loudness modification to the accepted blocks of data having said each block size other than the largest block size or to delayed versions of the accepted blocks of data having said each block size less than the largest block size.

18. An apparatus as recited in claim 17, wherein the combining of each plurality of consecutive accepted all having said each short block size smaller than the longest block size includes at least one of the set consisting of:
interleaving frequency domain data of the blocks being combined;
replicating values of frequency domain data of the blocks being combined;
interpolating between values of frequency domain data of the blocks being combined; and
for a particular block size that is a divisor of the longest block size and is smaller than half of the longest block size, and for a particular plurality of consecutive blocks having the particular block size, the particular plurality starting with a first subgroup of consecutive blocks that in combination have energy no larger than a pre-determined level, the first subgroup followed by a second subgroup of consecutive blocks of the particular plurality that forms the end of the particular plurality, the consecutive blocks of the second subgroup in combination having energy greater than the pre-determined level,
partitioning the particular plurality of consecutive blocks into the first subgroup and the second subgroup,
combining the consecutive blocks of the second subgroup, the combining using interleaving to form a block of frequency domain data having an intermediate block size larger than the particular block size and smaller than the longest block size, and
combining the block of frequency domain data having the intermediate block size with the first subgroup of consecutive blocks of frequency domain data, the combining using replication or interleaving, the combining resulting in the formed block of frequency domain data at the longest block size.

19. An apparatus as recited in claim 17, wherein the one or more perceived loudness parameters include excitation parameters and specific loudness parameters, and wherein the at least one perceived loudness modification includes one or more of loudness leveling, gain control, noise compensation, and dynamic equalization.

20. An apparatus as recited in claim 17, wherein the frequency-domain audio data are from coded audio data coded by a perceptual coder, the coder using more than one block size, and wherein the more than one block size used by the perceptual coder includes a small block size corresponding to 256 time domain samples and a long block size corresponding to either 512 time domain samples or 2048 time domain samples.

* * * * *